United States Patent
Hayami et al.

(10) Patent No.: US 6,426,495 B1
(45) Date of Patent: Jul. 30, 2002

(54) TEMPERATURE COMPENSATING CIRCUIT, TEMPERATURE COMPENSATING LOGARITHM CONVERSION CIRCUIT AND LIGHT RECEIVER

(75) Inventors: Akihiro Hayami, Yokohama; Tadaaki Fujii, Tachikawa; Tomonao Kikuchi, Fujisawa; Tadashi Hatano, Yokohama; Yasuhiro Yamada, Fujisawa; Takayuki Nakao, Yokohama; Tomoaki Shimotsu, Yokohama; Toshiaki Murai, Yokohama; Tohru Oyama, Fujisawa; Hidehiro Ikeuchi, Chigasaki; Masayuki Miyoshi, Yokohama, all of (JP)

(73) Assignees: Hitachi, Ltd., Tokyo; Hitachi Communication System, Inc.; Hitachi Video and Information System, Inc., both of Yokohama, all of (JP)

( * ) Notice: Subject to any disclaimer, the term of this patent is extended or adjusted under 35 U.S.C. 154(b) by 82 days.

(21) Appl. No.: 09/603,953

(22) Filed: Jun. 26, 2000

(30) Foreign Application Priority Data

Jun. 24, 1999 (JP) ............................................. 11-177756
May 22, 2000 (JP) ........................................ 2000-154366

(51) Int. Cl.$^7$ .............................................. H01J 40/14
(52) U.S. Cl. ................................ 250/214 R; 250/214 C
(58) Field of Search .......................... 250/214 R, 214.1, 250/214 C, 238, 214

(56) References Cited

U.S. PATENT DOCUMENTS

| | | | | |
|---|---|---|---|---|
| 4,153,835 A | * | 5/1979 | Lau et al. | 250/214 C |
| 5,015,839 A | * | 5/1991 | Tanikoshi | 250/214 AG |
| 5,578,815 A | * | 11/1996 | Nakase et al. | 250/214 R |
| 6,157,022 A | * | 12/2000 | Maeda et al. | 250/214 R |

* cited by examiner

Primary Examiner—Robert H. Kim
Assistant Examiner—Irakli Kiknadze
(74) Attorney, Agent, or Firm—Antonelli, Terry, Stout & Kraus, LLP

(57) ABSTRACT

A temperature compensating circuit includes a first circuit network 1 between an inverting input terminal of an operational amplifier 13 and an output terminal of the operational amplifier 13, and a second circuit network 2 between the inverting input terminal of the operational amplifier 13 and a reference potential. At least one of the first circuit network and the second circuit network is made of an arrangement containing a plurality of series-connected thermistor/resistor pairs in which the thermistors are connected parallel to the resistors, and the temperature compensating circuit compensates a temperature-dependent signal which is inputted into a positive phase input terminal of the operational amplifier 13, and outputs the temperature-compensated signal.

6 Claims, 8 Drawing Sheets

TEMPERATURE COMPENSATING CIRCUIT, TEMPERATURE COMPENSATING LOGARITHM CONVERSION CIRCUIT AND LIGHT RECEIVER

BACKGROUND OF THE INVENTION

The present invention is related to a logarithm conversion circuit and the like, which detect light reception input intensity from a current of a photodiode of a light receiving circuit employed in an optical communication system, and monitor the detected light reception input intensity, and more specifically, is related to a temperature compensating circuit thereof.

In general, as is well known in the art, in order to perform a logarithm conversion, both a current under measurement and a reference current are supplied to two sets of bipolar elements, and then, a voltage difference between bases and emitters is derived. However, since a bipolar element contains a coefficient which is directly proportional to an absolute temperature as an inherent characteristic, a gain which is inversely proportional to the absolute temperature must be applied by a temperature compensating circuit in order to obtain a logarithm of a ratio of a current to be measured to a reference current irrespective of a temperature.

Conventionally, a temperature compensating circuit contained in a logarithm conversion circuit is arranged as shown in FIG. 2, as represented in a publication 1 ("Practical Operational Amplifier Circuit" written by Hideo Tsunoda, pages 40 to 41, Tokyo Electric University publishing section, Jul. 20, 1983), and a publication 2 ("operational Amplifier" edited/translated by Y. Kato, pages 298 to 305, Macgrow Hill K. K., Jun. 30, 1983). Reference numeral 11 shows a temperature sensing resistor, reference numeral 12 indicates a resistor, reference numeral 13 represents an operational amplifier, reference numeral 14 denotes an input terminal, and reference numeral 15 represents an output terminal. This operation is the positive-phase amplifier well known in the art. A voltage gain defined from the input terminal 14 of the positive-phase amplifier to the output terminal 15 thereof may be determined by both the temperature sensing resistor 11 and the resistor 12 of the feedback circuit which is connected to the inverting input terminal of the operational amplifier 13. That is, this voltage gain is equal to $(R_{11}+R_{12})/R_{11}$ (note that symbol "$R_{11}$" shows resistance value of temperature sensing resistor 11, and symbol "$R_{12}$" indicates resistance value of resistor 12). Since the temperature sensing resistor 11 owns such a temperature coefficient of approximately 0.39%/° C., such a gain is obtained which is inversely proportional to the absolute temperature. As the temperature sensing resistor 11, a metal such as platinum is utilized as a resistance member.

SUMMARY OF THE INVENTION

An object of the present invention is to provide a low-cost light receiving monitor circuit operable in high precision without a temperature dependent characteristic, while employing a logarithm conversion circuit containing a temperature compensating circuit, is also to provide a light receiver and an optical communication system.

Very recently, in an optical communication system, since light reception input intensity is monitored, abnormal conditions of a light transmitter, a transmission path, and the like, which constitute light transmission sides, are detected. Then, warning information of the abnormal conditions, and also interruption of the optical communication system are required.

However, when a current derived from a photodiode is merely monitored, for instance, in accordance with the recommendations of the ITU-T (International Telecommunication Union-Telecommunication Standardization Section), the light reception input strength becomes −28 to −8 dBm in STM-4, and becomes −28 to −9 dBm in SMT-16. It is required to represent such a light reception input strength range which is approximately 100 times higher than the light reception input strength. As a result, a logarithm conversion circuit for converting the light reception input strength into a strength in a logarithm scale is necessarily required.

Furthermore, there are many cases that an avalanche photodiode (will be abbreviated as an "APD" hereinafter) is employed, while optical communication systems are constructed in long transmission paths. In general, an APD is used in such a manner that a current multiplication ratio specific to this APD is reduced in a high level range of a light reception input level. As a result, in order to monitor a current of the avalanche photodiode, it is desirable to provide a function for correcting a change in the current multiplication ratio other than a temperature compensation made in a logarithm conversion circuit.

Also, since the high-cost platinum resistors and the like are used in the conventional temperature compensating circuit, there is a drawback that the low-cost light receiving monitor circuit could not be realized.

The present invention may remove the above-described drawbacks, and may provide a low-cost light receiving monitor circuit operable in high precision without having a temperature dependent characteristic, while employing a logarithm conversion circuit containing a temperature compensating circuit, and also may provide a light receiver and an optical communication system.

A temperature compensating circuit, according to an aspect of the present invention, is featured by comprising: a first circuit network between an inverting input terminal of an operational amplifier and an output terminal of the operational amplifier; and a second circuit network between the inverting input terminal of the operational amplifier and a reference potential; wherein: at least one of the first circuit network and the second circuit network is made of an arrangement containing a plurality of series-connected thermistor/resistor pairs in which the thermistors are connected parallel to the resistors; and the temperature compensating circuit compensates a temperature-dependent signal which is inputted into a positive phase input terminal of the operational amplifier, and outputs the temperature-compensated signal.

Also, a temperature compensating circuit, according to a modification of the present invention, is featured by comprising: a first circuit network between an inverting input terminal of an operational amplifier and an output terminal of the operational amplifier; and a second circuit network between the inverting input terminal of the operational amplifier and a signal input terminal thereof; wherein: a positive phase input terminal of the operational amplifier is connected to the ground; at least one of the first circuit network and the second circuit network is made of an arrangement containing a plurality of series-connected thermistor/resistor pairs in which the thermistors are connected parallel to the resistors; and the temperature compensating circuit compensates a temperature-dependent signal which is inputted into the signal input terminal of the operational amplifier, and outputs the temperature-compensated signal.

Also, the temperature compensating circuit is featured by comprising a logarithm converting circuit, wherein: an output terminal of the logarithm converting circuit is connected to the input of the above-explained temperature compensating circuit.

Also, a temperature compensating logarithm circuit, according to another aspect of the present invention, is featured by comprising: a third circuit network between the output terminal of the above-explained temperature compensating logarithm converting circuit and a positive phase input terminal of a second operational amplifier; and a fourth circuit network between the output terminal of the second operational amplifier and the positive phase input terminal thereof; in which at least one of the third circuit network and the fourth circuit network is made of an arrangement containing a plurality of series-connected thermistor/resistor pairs in which the thermistors are connected parallel to the resistors; and in the case that a gain defined from the inverting input terminal of the second temperature compensating circuit up to the output of the second operational amplifier is equal to (1+G), a gain defined from the positive phase input terminal of the pre-staged operational amplifier up to the output of the pre-staged operational amplifier is nearly equal to (1+(1/G)).

Also, a temperature compensating logarithm converting circuit, according to another aspect of the present invention, is featured by comprising: an adding circuit for entering thereinto a voltage of one output unit of the logarithm converting circuit as a first input, and for entering thereinto a voltage of the other output unit of the logarithm converting circuit as a second input, in which an output of the adding circuit is equal to a summation between p-times multiplied first input voltage (p>0) and (1−p) times multiplied second input voltage; a bipolar element in which the output voltage of the adding circuit is applied to the emitter thereof; a resistor whose one terminal is connected to the base of the bipolar element; and a voltage follower circuit in which one terminal of the resistor is connected to the input unit thereof, and the output unit thereof is connected to the first voltage; wherein: a potential difference between the output unit of the second operational amplifier and the other terminal of the resistor is outputted.

Also, the temperature compensating logarithm converting circuit is featured by that the second input of the adding circuit is a voltage appeared on the second output terminal of the logarithm converting circuit.

Also, the temperature compensating logarithm converting circuit is featured by that the adding circuit is comprised of a resistor divider, and a second voltage follower for entering thereinto a potential at an intermediate point of the resistor divider; both ends of the resistor divider are the input terminals of the adding circuit; and the output terminals of the second voltage follower are the output terminals of the adding circuit.

Also, a light receiver, according to another aspect of the present invention, is featured by comprising: a light receiving element for receiving a light signal; a first amplifier for amplifying the signal which is photo-electrically converted by the light receiving element; a second amplifier for further amplifying the output signal of the first amplifier; a discriminating/reproducing device for discriminating/reproducing the output of the second amplifier to output the reproduced signal; a timing extracting device for extracting a clock component from the output of the second amplifier to output the clock; and a temperature compensating logarithm converting circuit for entering thereinto a portion of the output signal of the light receiving element to convert the entered signal into a logarithm, whereby a light reception input intensity monitored signal is outputted.

As previously described in detail, in accordance with the present invention, while using the logarithm converting circuit containing the temperature compensating circuit, it is possible to provide a low-cost light reception monitor circuit, a low-cost light receiver, and a low-cost optical communication system, which are operable in high precision without having the temperature dependent characteristic.

DESCRIPTION OF THE EMBODIMENTS

Figure 1:
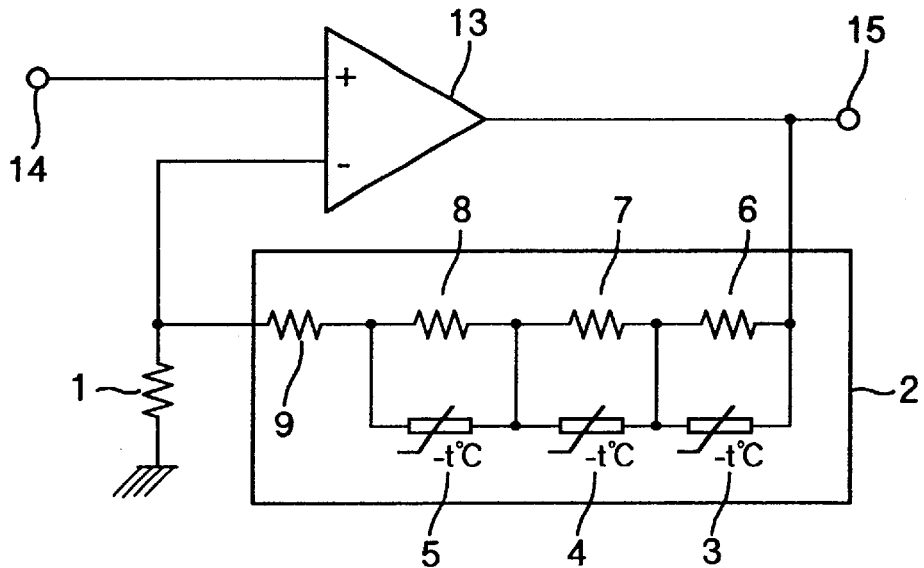
FIG. 1 is a circuit diagram for showing a first embodiment mode of the present invention.
Figure 2:
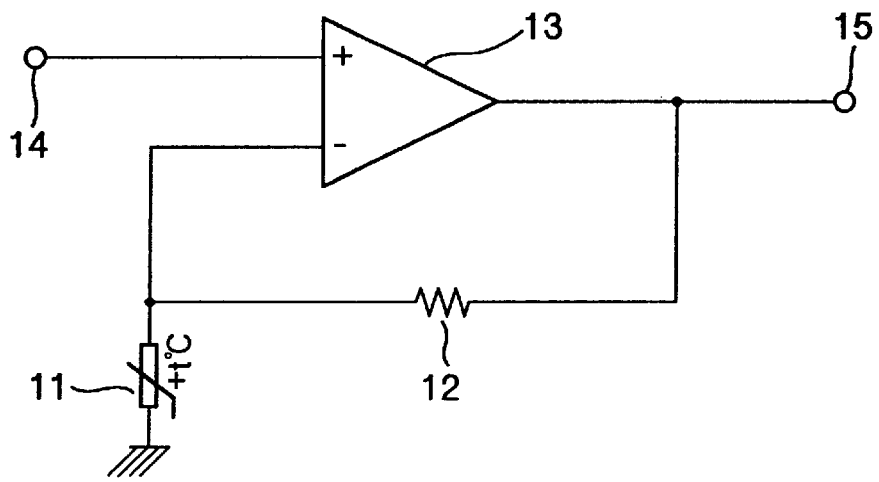
FIG. 2 is the temperature compensating circuit contained in the conventional logarithm conversion circuit.

FIG. 1 is a circuit diagram for showing a first embodiment mode of the present invention. A description will now be made of the first embodiment mode shown in FIG. 1.

Reference numeral 1 indicates a resistor, reference numeral 2 shows a resistor circuit network having a negative temperature coefficient, reference numerals 3 to 5 represent thermistors, and reference numeral 6 to 9 are resistors. As the thermistors, an NTC type thermistor is recommendable. This operation is a simple positive-phase amplifier. A voltage gain defined form a input terminal 14 to an output terminal 15 is determined by the resistor 1 and the resistor circuit network 2, which are connected to an inverting input terminal of an operational amplifier 13, namely is $(R_1+R_2)/R_1$ (note that symbol "$R_1$", shows a resistance value of resistor 1, and symbol "$R_2$" represents a resistance value of an resistor circuit network 2). The resistor circuit network 2 is constituted by the thermistors 3 to 5 which are series-connected to the resistor 9, and also the resistors 6 to 8 which are connected parallel to the respective thermistors 3 to 5. In order to obtain a gain which is inversely proportional to an absolute temperature, the resistance value $R_2$ is designed to have a proper negative temperature coefficient. It should be noted that the resistor 9 may be alternatively conceived as such a circuit element formed by connecting thermistors having infinite resistance values in parallel thereto.

Figure 3:
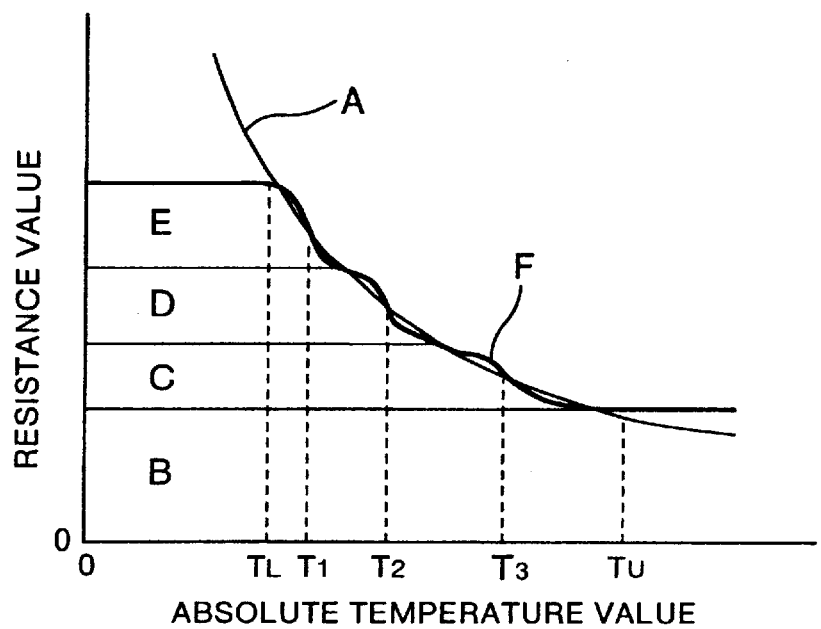
FIG. 3 is a graphic representation for visually supplementary-explaining a temperature characteristic of $(R_1+R_2)$.

A first qualitative description will now be made of a characteristic of the resistor circuit network 2. At this time, it is now assumed that the resistance values of the respective resistors, and the resistance values/B-constants of the respective thermistors are selected in proper manners. Since the thermistors 3 to 5 own sufficiently high resistance values in sufficiently low temperatures, $R_2$ constitutes a total value of the resistance values of the resistors 6 to 9. While the temperature is increased, since the resistance value of the thermistor 3 is first decreased, $R_2$ is approximated to a total value of the resistance values of the resistors 7 to 9. When the temperature is furthermore increased, since the resistance value of the thermistor 4 is also decreased, $R_2$ is approximated to a total value of the resistance values of the resistors 8 and 9. When the temperature becomes a sufficiently high temperature, since the resistance value of the thermistor 5 is also decreased, $R_2$ is approximated to a resistance value of the resistor 9. FIG. 3 is a graphic representation for visually supplementary-explaining a temperature characteristic of $(R_1+R_2)$ provided in the circuit of FIG. 1. An X-axis represents an absolute temperature and a Y-axis shows a resistance value. A curved line "A" indicates an-ideal value where a resistance value is inversely proportional to the absolute temperature. Assuming now that a lower temperature limit value is "$T_L$" and an upper temperature limit value is "$T_U$", $R_1+R_2$ may own a temperature characteristic approximated to the curved line A within a predetermined temperature range $T_L$ to $T_U$. In the below-mentioned explanation, it is now assumed that $R_3$ to $R_5$ show resistance values of the thermistors 3 to 5, $R_6$ to $R_9$ represent resistance values of the resistors 6 to 9, and $T_1$ to $T_3$ indicate temperatures at which the resistance values of the thermistors are made coincident with the resistance values of the corresponding resistors connected parallel thereto. In this description, the temperatures $T_1$ to $T_3$ will be referred to as "equi-resistance temperatures." For instance, while an attention is given only to the resistor 6 and the thermistor 3, a parallel composite resistor between the resistor 6 and the thermistor 3 is mainly defined only by the resistance value of the resistor 6 in a low temperature. On the other hand, since the resistance value of the thermistor 3 is approximated to zero in a high temperature, a parallel composite resistor between the resistor 6 and the thermistor 3 is approximated to zero. At this time, while the temperature is varied, such a temperature at which the resistance value of the resistor 6 becomes equal to the resistance value of the thermistor 3 is defined as the equi-resistance temperature.

In FIG. 3, a region "B" corresponds to $R_1+R_9$, and is a constant value irrespective of the temperature. A region "C" corresponds to a parallel resistor between $R_5$ and $R_8$, is approximated to $R_8$ in the low temperature, and is approximated to 0 in the high temperature, and is varied in the vicinity of the equi-resistance temperature $T_3$. Similarly, a region D corresponds to a parallel resistor between $R_4$ and $R_7$, and is varied in the vicinity of the equi-resistance temperature $T_2$. A region E corresponds to a parallel resistor between $R_3$ and $R_6$, and is varied in the vicinity of the equi-resistance temperature $T_1$. As a result, $R_1+R_2$ is indicated by a curved line "F" as a total region of the regions B to E, and constitutes an approximated curved line with respect to the curved line A in the temperature range $T_1$ to $T_U$.

Next, a description will now be made of a method for determining the resistance values $R_3$ to $R_5$ of the thermistors 3 to 5, the R constants thereof, and the resistance values $R_6$ to $R_9$ of the resistors 6 to 9. A resistance value (namely, resistance value at reference temperature such as 25° C.) of a commercially available thermistor, and a B constant thereof cannot be freely selected, but must be selected from a series of numeral values which are determined as standard values. As a consequence, a method for determining a final constant will become slightly cumbersome (will be explained later). However, at the beginning, a description will be made of such a fact that both the resistance values of the thermistor and the B constants thereof may be freely selected. For the sake of easy understanding, the B constants are sufficiently large, and thereafter, are sequentially approximated to practically available values.

Figure 4:
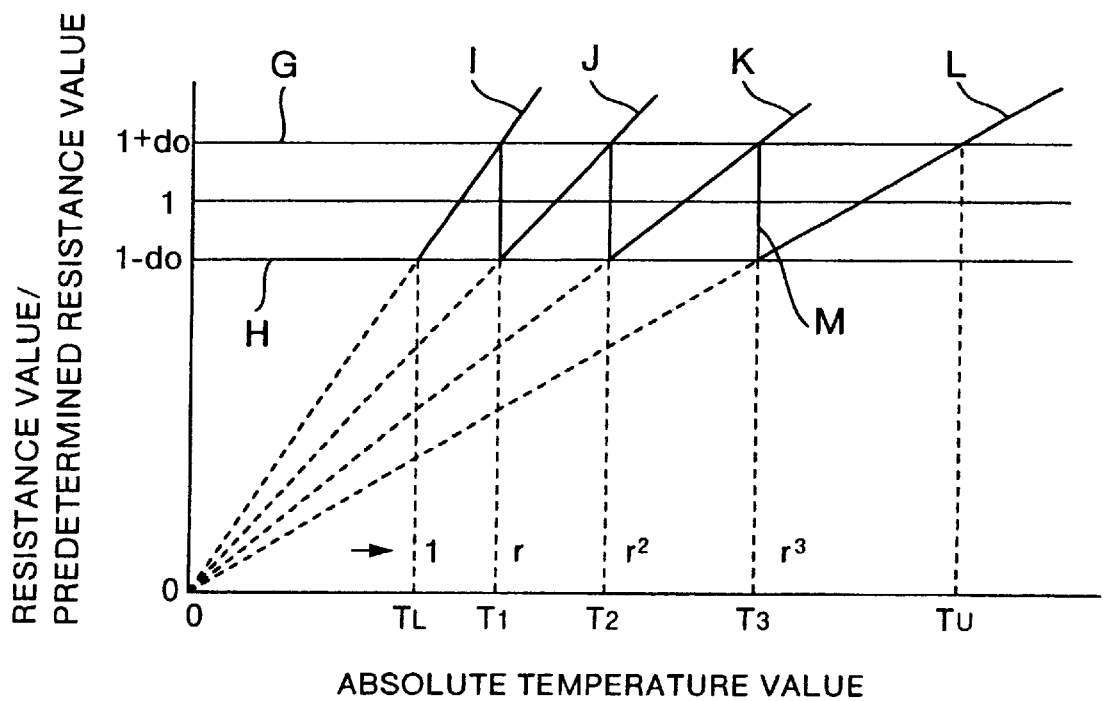
FIG. 4 is a diagram for explaining a designing method used in such a case that a B-constant of a thermistor is approximated to an infinite value.

FIG. 4 is a diagram for explaining a designing method in the case that a B constant of a thermistor is nearly equal to an infinite value, and the B constant constitutes a starting point when the B constant is practically available value. An X-axis indicates an absolute temperature, and a Y-axis represents a resistance value/a predetermined resistance value. "1" of the Y-axis implies an error of 0. It should be noted that an "error" in this case is not expressed by a resistance value, but is indicated by a ratio. On the X-axis, a predetermined temperature range $T_L$ to $T_U$ is equally divided by (n−1) with respect to a total number "n" (n=3 in the following description) of the thermistors to be used, so that equi-resistance temperatures $T_1$ to $T_3$ are obtained. At this time, a ratio "r" is equal to $(T_U/T_L)^{1/(n+1)}$. While utilizing a similar triangle of FIG. 4, an error $d_0=(r-1)/(r+1)$ is calculated on the Y-axis. When both $(1+d_0)$ and $(1-d_0)$ are used and are extended in parallel to the X-axis, both a straight line G and a straight line H are made. When straight lines I to L which are intersected with the straight line G and pass through an origin are drawn at the respective temperatures $T_1$, $T_2$, $T_3$ and $T_U$, the respective straight lines I to L are intersected with the straight line H at the temperatures $T_L$, $T_1$, $T_2$, $T_3$. The straight line L corresponds to $R_1+R_9$; a difference between the straight line K and the straight line L corresponds to a parallel resistor between $R_5$ and $R_8$; a difference between the straight line J and the straight line K corresponds to a parallel resistor between $R_4$ and $R_7$; and a difference between the straight line I and the straight line J corresponds to a parallel resistor between $R_3$ and $R_6$. As a result, $(R_1+R_2)$ is expressed by a broken line M shown as a wide line. The resistance values of $R_6$ to $R_8$ are varied in the ratio of $2d_0$ with respect to a preselected resistance value $R_i$ at the equi-resistor temperatures $T_1$ to $T_3$ corresponding thereto. These resistance values may constitute values which are inversely proportional to the equi-resistor temperatures $T_1$ to $T_3$.

On the other hand, when the relationship is expressed by a formula irrespective of the magnitude of the B constant, the following formula(1) is obtained by employing such a fact that a relationship between the resistance value $R_a$ of the thermistor and the resistance value $R_b$ of the thermistor at the absolute temperatures $T_a$ and $T_b$ is given as follows: $R_a/R_b = \exp[B(T_a^{-1} - T_b^{-1})]$ (note that symbol "B" is B constant), and also the thermistor and the resistor corresponding thereto own the same resistance values at the equi-resistance temperatures $T_1$ to $T_3$:

[Formula 1]

$$\frac{\text{resistance value/predetermined}}{\text{resistance value}} = (R_1 + R_2)/C/T$$

$$= \frac{R_6 T/C}{1 + e^{B_1\left[\frac{1}{T_1} - \frac{1}{T}\right]}} + \frac{R_7 T/C}{1 + e^{B_2\left[\frac{1}{T_2} - \frac{1}{T}\right]}} + \frac{R_8 T/C}{1 + e^{B_3\left[\frac{1}{T_3} - \frac{1}{T}\right]}} + (R_9 + R_1)T/C$$

In this formula, symbols $B_1$ to $B_3$ show B constants of the thermistors, and symbol C indicates a constant.

In the case that $(R_1+R_2)$ is equal to 10 KΩ at the temperature of 25° C. (298 K), the value of the constant C is equal to $2.98 \times 10^6$ [ΩK], namely a provisional value in the design aspect. This value of the constant C may be replaced by a properly-selected value when a practically available circuit constant is determined, as will be discussed later.

As previously shown in FIG. 4, when the B constant is approximated to the infinite value, the corresponding thermistor at the respective points of the equi-resistance temperature is operated in the same manner to the switches, and the thermistor is shortcircuited on the upper side of the equi-resistance temperature whereas the thermistor is opened on the lower side of this equi-resistance temperature. As a result, an error becomes relatively large. However, when the B constant becomes small since an inclination (slope) defined from a high peak of the broken line up to a low peak located at a right side of this high peak becomes gentle, it may be predicted that the error becomes small.

Figure 5:
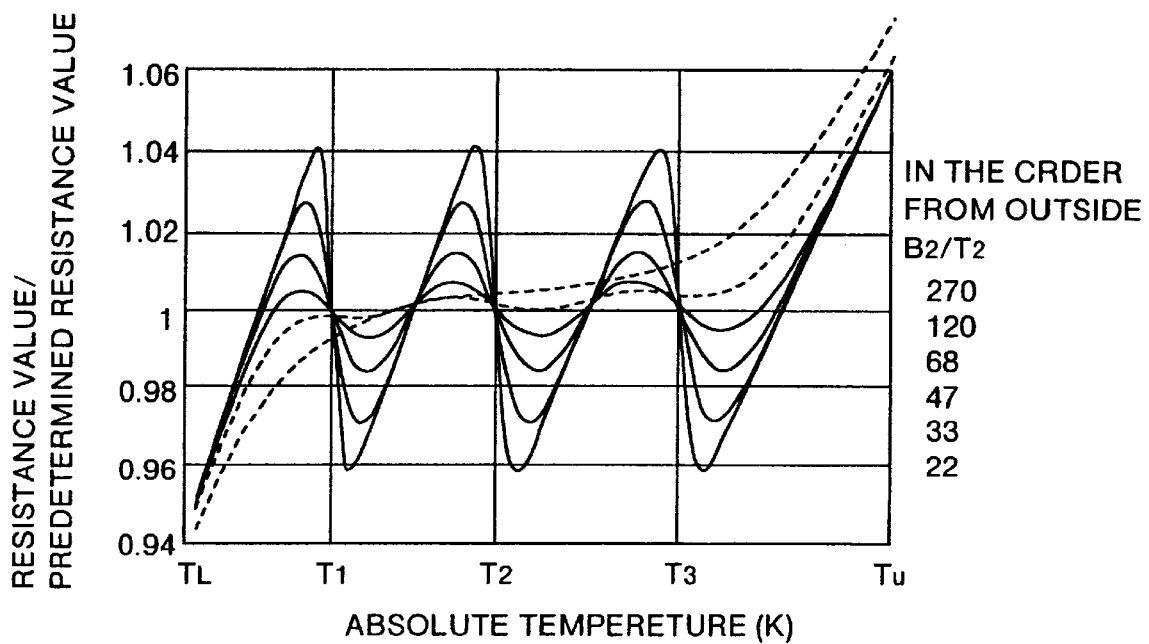
FIG. 5 is a graphic representation for describing a problem occurred in such a case that the B-constant is approximated to approximately 3,000 to 5,000 K.

FIG. 5 is a graphic representation for explaining problems in the case that the B constant is approximated to approximately 3,000 to 5,000 K. That is, while a portion of large numbers of parameters is fixed, assuming now that $B_1/T_1 = B_2/T_2 = B_3/T_3$ so as to narrow a degree of freedom, this ratio is once reduced up to 270 to 22 (practically speaking, up to approximately 15). Similar to FIG. 4, an X-axis of FIG. 5 indicates an absolute temperature and a Y-axis thereof represents a resistance value/a predetermined resistance value. A group of curved lines corresponds to both the equi-resistance temperature and the resistance value, as explained in connection with FIG. 4, and are obtained by varying only the B constant. The ratios of $B_1/T_1 = B_2/T_2 = B_3/T_3$ are equal to 270, 120, 68, 47, 33, and 22 in the order of large ripples. It may be expected that the ripple is decreased while the ratio of $B_1/T_1$ and the like is reduced.

When the ratio is reduced to 33, a shift along a plus direction, a left-directed down, and a right-directed up become conspicuous in the vicinity of a center within a predetermined temperature range. In order to avoid these shifts, a new constant must be newly set by decreasing $T_1$, by increasing $T_3$, by increasing $R_6$ to $R_8$, and by decreasing $R_9$.

This new constant is to realize such a shape that a ripple is extended up to a full-sized frame within a rectangular shape made by reducing the graph frame of FIG. 5 in the Y direction is compressed to 2d (symbol "d" shows an error, and is smaller than $d_0$ of FIG. 4). This shape is such a rectangular shape that in the case of each B2/T2, this rectangular shape is made of a shape surrounded by a straight line for connecting high peaks of a ripple to each other, a straight line for connecting low peaks thereof to each other, $T_L$ and $T_U$. This rectangular shape could be probably obtained by solving simultaneous equations in which values at three high peaks of a ripple and $T_U$ are obtained as (1+d), values of three low peaks of the ripple and $T_L$ are obtained as (1−d), and also differential coefficients of six positions in the high peak and the low peak of the ripple are obtained as 0. However, since the simultaneous equations cannot be easily solved, the below-mentioned description will be made by employing an approximated solution obtained by the repetition calculation. Even if the simultaneous equations are solved by the mathematical manner to obtain a correct solution, the approximated solution must be calculated in order to finally use the realistic components (will be explained later).

Figure 6:
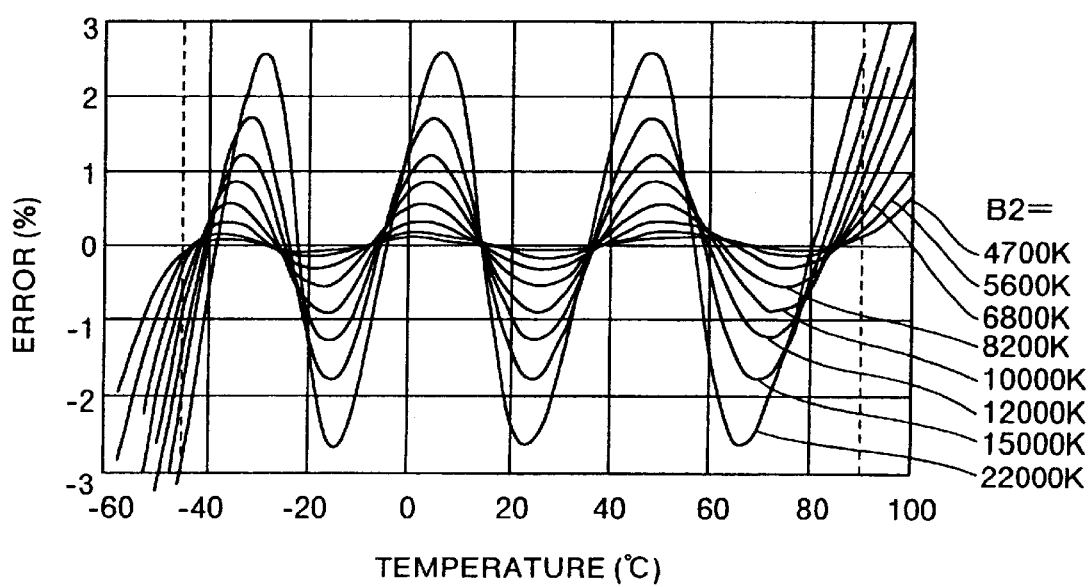
FIG. 6 is a graphic representation for explaining an approximated solution which is obtained under condition of $B_1/T_1=B_2/T_2=B_3/T_3$ by varying $B_2$ in several steps.

FIG. 6 is a graphic representation of such an approximated solution which is obtained in such a manner that "values at three positions on a high peak of a peak and $T_U$ become (1+d), and values at three positions on a low peak of a peak and $T_L$ become (1−d)", while $B_2$ is varied in several stages under conditions of $T_L = 228$ K($-45°$ C.), $T_U = 363$ K($-90°$ C.), and $B_1/T_1 = B_2/T_2 = B_3/T_3$, and further, the equi-resistance temperatures $T_1$ to $T_3$, the resistance values $R_6$ to $R_8$, and the resistance value $(R_1+R_9)$ are adjusted on the calculation manner every stage. In FIG. 6, an X-axis shows a temperature and a Y-axis indicates an error (%). As a method for calculating an approximated solution, first of all, $B_2$ is set to the largest desirable value, and both the resistance value and the equi-resistance temperature as described in FIG. 4 are selected as an initial value. Both the resistance value and the equi-resistance temperature are gradually moved one by one in such a manner that "values at three positions on a high peak of a peak and $T_U$ become (1+d), and values at three positions on a low peak of a peak and $T_L$ become (1−d)." When the solution is obtained, the second largest $B_2$ is selected. While using the preceding approximated solution as a starting point, the adjustment is again carried out. Since the ratio of $B_2/T_2$ and the like is successively decreased, the graphic representation of FIG. 6 is obtained.

A table 1 is a constant table corresponding to FIG. 6. A column of this table 1, in which $B_2$ is infinite, is a constant corresponding to the explanation of FIG. 6. It should be noted that columns of infinite value, 3,900 K and 3,300 K are omitted from FIG. 6, for the sake of easy observation. It may be confirmed that a new constant is present based upon FIG. 6 and the table 1.

| | equi-resistance temperature (K) | | | resistor (Ω) | | | | infinite value |
| --- | --- | --- | --- | --- | --- | --- | --- | --- |
| B2 (K) | T1 | T2 | T3 | R6 | R7 | R8 | R9 + R1 | error (%) |
| infinitely large | 256.11 | 287.69 | 323.16 | 1351.3 | 1203.0 | 1070.9 | 8686.1 | 5.81 |
| 22000 | 250.55 | 287.55 | 330.00 | 1640.0 | 1425.0 | 1240.0 | 8417.0 | 2.65 |
| 15000 | 248.70 | 287.30 | 331.80 | 1735.0 | 1493.0 | 1295.0 | 8335.0 | 1.75 |
| 12000 | 247.60 | 287.40 | 333.40 | 1820.0 | 1535.0 | 1333.0 | 8266.0 | 1.25 |
| 10000 | 246.35 | 287.40 | 335.00 | 1920.0 | 1580.0 | 1380.0 | 8190.0 | 0.90 |
| 8200 | 244.80 | 287.40 | 337.10 | 2060.0 | 1636.0 | 1446.0 | 8084.0 | 0.55 |
| 6800 | 243.10 | 287.85 | 340.20 | 2260.0 | 1696.0 | 1526.0 | 7940.5 | 0.33 |
| 5600 | 240.75 | 288.56 | 344.56 | 2555.0 | 1778.0 | 1631.0 | 7743.0 | 0.18 |
| 4700 | 237.92 | 289.20 | 349.50 | 2900.0 | 1870.0 | 1748.0 | 7522.0 | 0.092 |
| 3900 | 234.25 | 290.62 | 357.00 | 3409.9 | 1996.7 | 1887.0 | 7215.9 | 0.043 |
| 3300 | 230.14 | 292.38 | 365.90 | 4017.8 | 2139.5 | 2024.7 | 6875.3 | 0.020 | calculation condition: $T_L = -45°$ C. (228 K), $T_U = 90°$ C. (363 K), $B_1/T_1 = B_2/T_2 = B_3/T_3$, C = 10 KΩ

Figure 7:
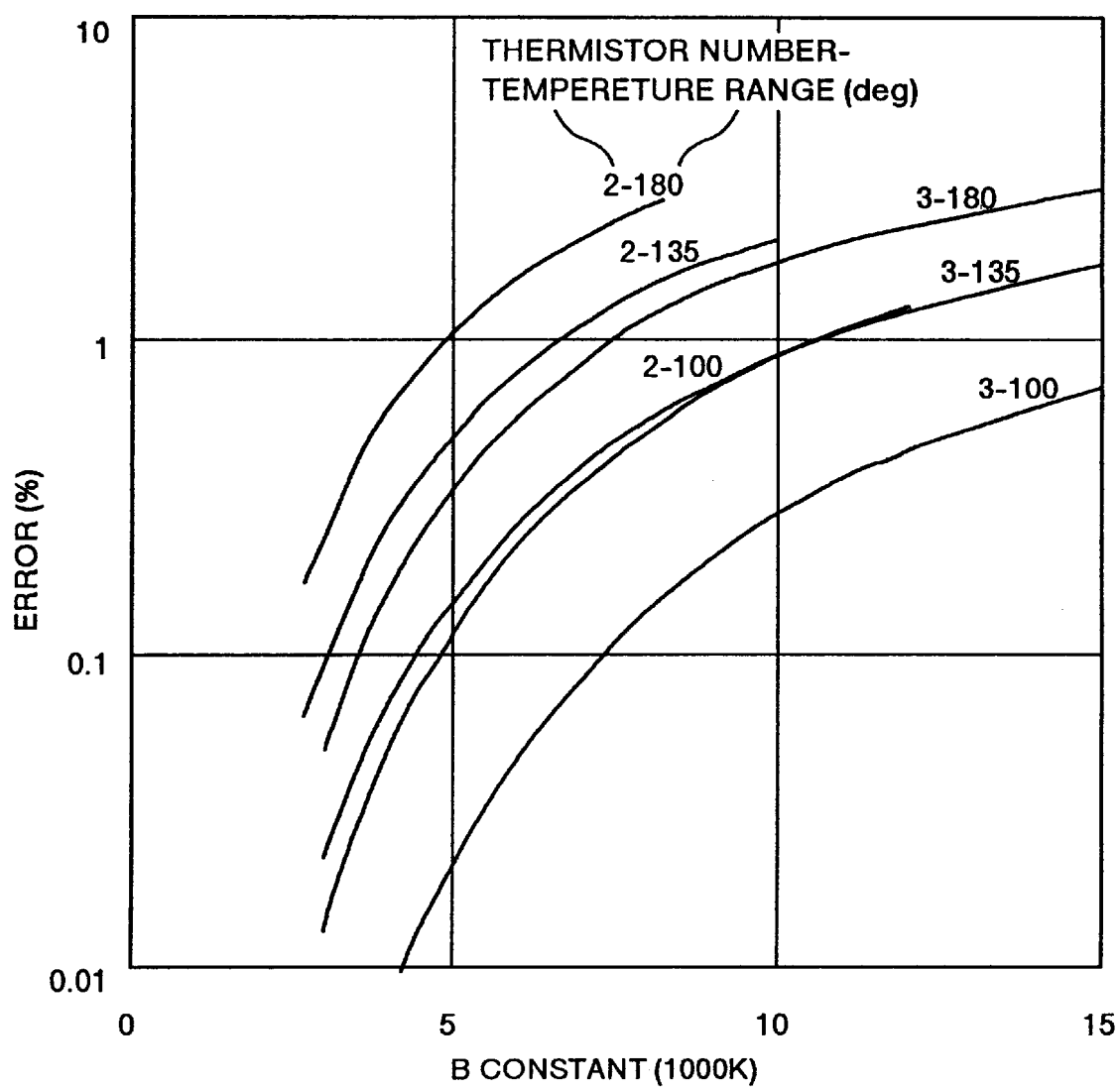
FIG. 7 is a graphic representation for showing an error-to-B constant which is calculated by an approximated solution.

FIG. 7 is a graphic representation for showing a characteristic of an error-to-B constant which is calculated by an approximated solution. An X-axis of FIG. 7 shows a B constant, and a Y-axis thereof indicates an error (%). Both a total number of thermistors and a temperature range are used as a parameter. In the case that two sets of thermistors are employed, a calculation is made under condition of $B_1/T_1 = B_2/T_2$. In the case that three sets of thermistors are employed, a calculation is made under condition of $B_1/T_1 = B_2/T_2 = B_3/T_3$. Also, in FIG. 7, while the temperature range of 100 deg is −25 to 75° C.; the temperature range of 135 deg is −45 to 90° C.; and the temperature range of 180 deg is −55 to 125° C, the calculation is carried out. When a total number of thermistors is selected in correspondence with a preselected temperature range with having the B constant on the order of 3,000 to 5,000 K, namely commercially available, a practically sufficient error (for example, within 0.1%) can be achieved.

In the above-described explanations, the following two different problems are neglected. That is to say, as one problem, both the resistance value of the thermistor and the B constant thereof must be selected from the actually limited numeral values (for example, resistance value is E-6 series, B constant is 3250 K with respect to nominal resistance 22 to 150Ω, and B constant sequentially becomes 3650, 4100, 4550, and 4750 K every time nominal resistance is increased by one digit). As the other problem, it is so assumed that $B_1/T_1 = B_2/T_2 = B_3/T_3$. However, since the B constant cannot be freely selected in the actual case, this assumption cannot be satisfied. Next, a description will now be made of a method capable of solving these problems. In FIG. 6, while one curved line with employment of the realistic value is used as a starting point, the resistance value $R_5$, of the thermistor 5 at the equi-resistance temperature $T_3$ is determined to be equal to approximately $R_8$. Furthermore, while paying an attention to such a fact that an absolute value of a resistor does not contribute a characteristic, since it is a coefficient circuit, the value of $(R_1+R_2)$ is changed in such a manner that the resistance value $R_5$ of the thermistor 5 at the equi-resistance temperature $T_3$ is made coincident with $R_8$. Subsequently, a selection is made of such thermistors whose resistance values at the equi-resistance temperatures $T_1$ and $T_2$ are approximated to $R_6$ and $R_7$, respectively. Next, a fine adjustment is carried out so as to minimize the error.

In this case, there are the following most important factors. Firstly, the thermistor must be set out from the adjusting subject. Secondly, since the heights between the high peaks of the ripple, or the heights between the low peaks of the ripple are not always made coincident with each other, a proper compromise is required. Also, it is assumed that the resistance value calculated as the result of fine adjustment other than the thermistor is realized by a composite resistance of plural resistors.

The above-described explanations may reveal such a fact that in accordance with the first embodiment mode of the present invention shown in FIG. 1, the desirable characteristic could be realized by employing the realistic components. Also, the above-described explanation has been made in such a case that a total number of thermistors is selected to be n=3. Alternatively, this explanation may be similarly applied to such a case that n=2, or n is larger than, or equal to 4.

Also, the above-described explanation has been made of the positive phase amplifier. Alternatively, this explanation may be similarly and apparently applied to an inverting amplifier. In this alternative case, while $(R_1+R_2)$ is used as a feedback-sided resistor, a resistance value of an input side is selected to be an arbitrary value.

The above-described explanation is made of such a case that the gain of this circuit is inversely proportional to the absolute temperature. Alternatively, the constant calculating method explained in the description subsequent to FIG. 4 may be applied to other circuits. For example, there is a major different point. In the case of predetermined resistor $R_i=C/T^m$ (note m>0), the straight lines I to L of FIG. 4 correspond to a curved line group which passes through an origin defined by multiplying $T^m$ by a coefficient. The error $d_0$ obtained when the B constant is approximated to the infinite value is larger than that of FIG. 4 if m>1, and is smaller than that of FIG. 4 if m<1. The fact that the equi-resistance temperatures $T_1$ to $T_3$ at the starting point constitute the geometrical progression in combination with $T_L$ and $T_U$ is similar to that of FIG. 4. Furthermore, in the case that there are different functions with the form of $R_i=C/T^m$ and also there is such a form which can be hardly expressed in view of mathematical view, a relatively approximated form with $R_i=C/T^m$ is selected so as to define a constant of the starting point. Then, these functions may be fitted to the original characteristics in the adjustment stage.

In the above-described explanations, the gain of this circuit owns the negative temperature coefficient. Alternatively, the present invention may be applied to such a case that a positive temperature coefficient is realized. In this alternative case, the resistor 1 is replaced by the resistor circuit network 2 in the circuit connection of FIG. 1.

Figure 8:
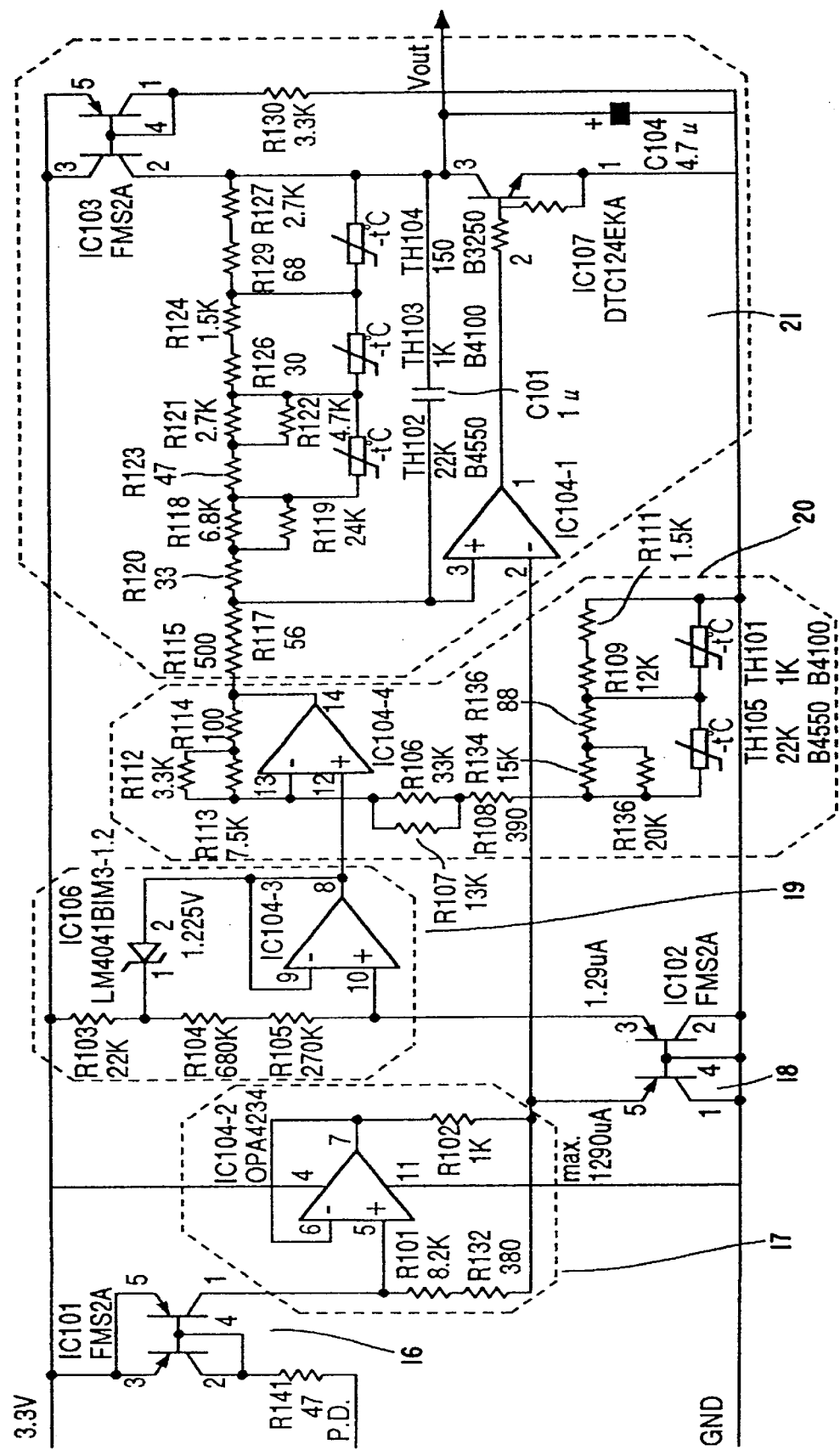
FIG. 8 is a circuit diagram of a second embodiment mode according to the present invention.

FIG. 8 is a circuit diagram of a second embodiment mode of the present invention. Now, a description will be made of FIG. 8.

As a circuit, there are provided a current mirror 16, a current amplifying circuit 17, logarithm converting paired transistors 18, a reference current generating circuit 19, and a second temperature compensating (gain compensating) circuit 20 in addition to a temperature compensating circuit 21 similar to that of FIG. 1. The entire circuit corresponds to a logarithm converting circuit.

The operation of this logarithm converting circuit will now be summarized as follows: That is, a current supplied to a photodiode is mirrored by the current mirror 16, and after the mirrored current is amplified by the current amplifying circuit 17, the amplified current is injected to the emitter of one transistor of the paired transistors 18. At the same time, while a potential of this emitter is used as a positive-phase input of the temperature compensating circuit 21, the reference current generated by the reference current generating circuit 19 is injected to the emitter of the other transistor of the paired transistors 18. The positive-phase input corresponds to an inverted input for a post-staged transistor as an operational amplifier IC 104-C1. At the same time, a potential of this emitter is applied via a voltage follower contained in the reference current generating circuit 19 to the second temperature compensating (gain compensating) circuit 20 so as to be gain-compensated. Thereafter, the gain-compensated emitter potential is applied to the inverting input terminal of the temperature compensating circuit 21. As is well known in the art, both the emitter potentials at the paired transistors 18 are directly proportional to the logarithms of the respective injected currents, and a potential difference between both the emitters is directly proportional to a logarithm of a ratio of both the injected currents and an absolute temperature.

The gain compensation executed in the second temperature compensating (gain compensating) circuit 20 is provided in order to handle a differential input signal by the temperature compensating circuit 21. Concretely speaking, this second temperature compensating circuit 20 is employed so as to derive a voltage output from the temperature circuit 21. This voltage output is directly proportional to the potential difference between both the emitters of the paired transistors 18. When a gain with respect to the positive phase input of the temperature compensating circuit 21 is expressed as "1+G", a gain with respect to the inverted input is expressed as "-G". As a consequence, when the gain of the temperature compensating circuit 20 is equal to $(1+G^{-1})$, a gain defined from both the emitters of the paired transistors 18 up to the output of the temperature compensating circuit 21 becomes 1+G and -(1+G). As a result, the output of the temperature compensating circuit 21 becomes (1+G) times higher than the potential difference between both the emitters of the paired transistors 18.

On the other hand, since the gain (1+G) of the temperature compensating circuit 21 is inversely proportional to the absolute temperature by a circuit network constructed of a resistor and a thermistor, which is similar to the circuit of FIG. 1, the gain $(1+G^{-1})$ of the temperature compensating (gain compensating) circuit 20 must be adapted to the temperature change. As a consequence, the circuit network constituted by the resistor and the thermistor of the temperature compensating (gain compensating) circuit 20 may be formed by replacing the resistor 1 and the resistor circuit network 2. However, in an actual circuit, with respect to such a fact that the output amplitude of the temperature compensating circuit 21 is 3V, the voltage to be canceled by the function of the temperature compensating (gain compensating) circuit 20 is equal to an emitter-to-base voltage of a transistor, which is smaller than 3 V by approximately one digit, and the error can hardly become conspicuous. Under such a reason, two thermistors are selected in the temperature compensating (gain compensating) circuit 20 in order to reduce the cost price. Also, while this logarithm converting circuit originally owns an error (fluctuation) as a totalized characteristic of large numbers of circuit components, a characteristic portion before being logarithm-converted is approximately 0.4 dB (in direction along which output is lowered in low temperature) within a temperature range of −40 to 85° C., which is calculated by converting a light input of the photodiode. This characteristic portion (not shown) implies that while the temperature is used as the parameter, when the output voltage-to-input current is expressed by the logarithmic graph, the characteristic thereof is moved in parallel thereto in response to the temperature. This error of the parallel-moved characteristic portion may be canceled by introducing the canceling portion during the adjustment of the temperature compensating (gain compensating) circuit 20. It should be noted that an error of the temperature portion after being converted may be introduced by the canceling portion during the adjustment of the temperature compensating circuit 21. However, in this embodiment mode, since this error is about +0.1 dB to −0.1 dB, this error is not introduced. The temperature portion (not shown) implies that while the temperature is used as the parameter, when the output voltage-to-input current is expressed by the logarithmic graph, the inclination thereof is varied in response to the temperature.

In this case, the contents of the temperature compensating circuit 21 will now be supplementary-explained. A combination of three circuit elements, namely an operational amplifier (IC 104-1), a transistor (IC 107) equipped with a resistor functioning as an inverter, and paired transistors (IC 103) functioning as a current source may be operated the operational amplifier of FIG. 1. The transistor (IC 107) equipped with the resistor is provided in order to solve such a problem that when the operational amplifier (IC 104-1) is operated under single power supply, the output voltage is not lowered up to 0 V. Also, the paired transistors (IC 103) are employed so as to save a current consumption when the output voltage is derived up to 3 V under power supply voltage of 3.3 V. Since the inverter (IC 107) is connected to the operational amplifier (IC 104-1), the polarity of the input terminal of the operational amplifier functioning as the composite member becomes opposite to the polarity of the operational amplifier (IC 104-1). A resistor circuit network of a feedback circuit is designed in order that such a gain inversely proportional to the absolute temperature is obtained in the temperature range of −45 to 90° C.

As previously explained, in accordance with the second embodiment mode of the present invention, since the differential input signal can be handled by adding the temperature compensating (gain compensating) circuit 20, there is such a merit that the logarithm converting circuit can be arranged under single power supply, and the low-cost logarithm converting circuit can be made. Furthermore, since it is possible to cancel the error contained in the parallel-moved portion of the output voltage-to-input current in the logarithm graph, when the inventive idea is used in the logarithm converting circuit, there is another merit that the logarithm converting circuit having high performance can be achieved.

In the above-description, the gain of the temperature compensating circuit owns either the positive temperature coefficient or the negative temperature coefficient. Alternatively, the present invention may be applied also to such a case that the gain of the temperature compensating circuit requires a positive temperature coefficient in one temperature range, and a negative temperature coefficient in the other temperature range in such a manner that a resistor circuit network having a plurality of thermistors similar to the resistor circuit network 2 is contained in two branches connected to the inverting input terminal of the operational amplifier.

Figure 9:
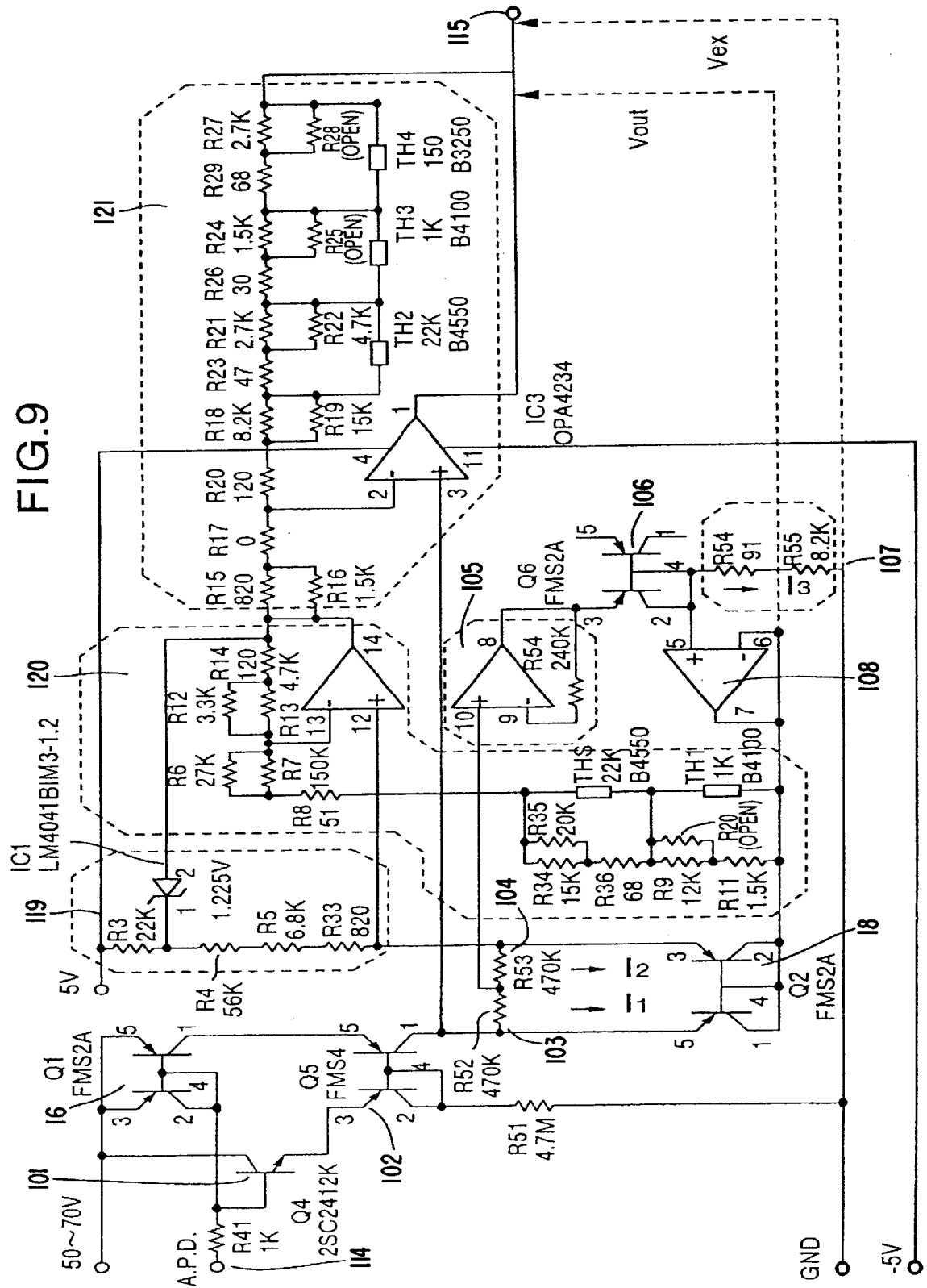
FIG. 9 is a circuit diagram for a third embodiment mode according to the present invention.

FIG. 9 is a circuit diagram for representing a third embodiment mode of the present invention. Now, the circuit diagram of FIG. 9 is explained. This circuit is featured by having such a function capable of correcting a change in a current amplification factor specific to an APD.

Figure 10:
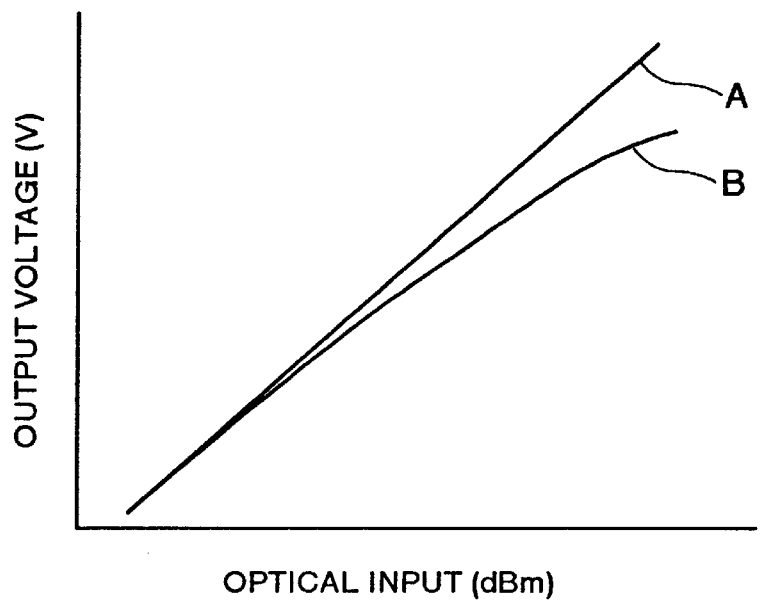
FIG. 10 is a graphic representation for representing a monitor input/output characteristic.

In the case that a light receiving element is a normally available photodiode, a relationship between an output voltage of this circuit and an optical input (dBm) is indicated as a straight line "A" shown in FIG. 10. On the other hand, in the case that the light receiving element is an avalanche photodiode, there is such a well-known current multiplication factor which is determined by a breakdown voltage and a bias voltage. In general, in order that this circuit is used with such a bias circuit operable in such a manner that this current multiplication factor is lowered while the optical input is increased, an output voltage of the circuit in the case of no correction represents such a slightly saturatable characteristic as shown by a curved line B of FIG. 10. In the circuit of FIG. 9, various ideas are made in order that this curved line B is approximated to the straight line A.

The circuit arrangement of FIG. 9 is arranged by a circuit equivalent to that of FIG. 8 and an additional circuit portion. Reference numeral 101 shows a transistor; reference numerals 102, 106, and 18 indicate paired transistors; and reference numerals 103 to 104 and 107 represent resistors. Also, reference numerals 105 and 108 show voltage followers; reference numeral 114 shows an input terminal; reference numeral 115 indicates an output terminal; reference numeral 16 shows a current mirror; reference numeral 119 indicates a reference current generating circuit; and reference numerals 120 and 121 denote coefficient circuits of temperature dependent characteristics.

Similar to the operation of FIG. 8, this operation is carried out as follows: That is, a current supplied from the input terminal 114 to the light receiving element is mirrored by a current mirror 16, and after the mirrored current is voltage-shifted by both the transistor 101 and the paired transistors 102, the voltage-shifted current is injected into the emitter of one transistor of bipolar type paired transistors 18. At the same time, while a potential appeared at this emitter is used as a positive-phase input of a coefficient circuit 121, a reference current generated by a reference current generating circuit 191 is injected into the other emitter of this paired transistor 18. Simultaneously, a potential appeared at this emitter is applied to a coefficient circuit 120. Thereafter, the gain of this applied emitter potential is corrected by this coefficient circuit 120, and then, the gain-corrected emitter potential is applied to the inverting input terminal of the coefficient circuit 121.

The above-explained circuit portion of FIG. 9 is equivalent to that of FIG. 8. Now, a supplementary explanation will now be made of a difference in the circuits, which is caused by a difference in designing conditions.

Since the voltage which is applied from the current mirror 16 to the avalanche photodiode is high, for example, 50 to 70 V, a voltage across between both the collectors of the current mirror 16 is decreased by utilizing the voltage shifts made by the transistor 101 and the paired transistors 102, so that the input/output current ratio of the current mirror 16 may be stabilized. The transistor 101 is operated as an emitter follower so as to determine both the emitter potentials of the paired transistors 102. Thus, a voltage between both the collectors of the current mirror 16 becomes substantially equal to a base-to-emitter voltage of the transistor 101. Also, since the avalanche photodiode performs the current multiplication, the current amplifying circuit which has been employed in FIG. 8 is no longer required. The reason why the reference current generating circuit 191 does not contain the voltage follower which has been used in FIG. 8 is simply reasonable in order to reduce the cost. Since the power supply of the operational amplifier employed in the coefficient circuit 121 is +5 V and −5 V, an output voltage range defined between −0.25 V and 1.85 V may be outputted only by the operational amplifier, so that both the inverting amplifier and the paired transistors which constitute the current source and have been employed in FIG. 8 may be omitted.

Also, operations of the additional circuit portion are given as follows: That is, an intermediate potential between both the emitters of the paired transistors 18 is derived by a voltage divider constituted by resistors 103 to 104, and is converted into a low impedance by a voltage follower 105. Thereafter, a common current may be supplied to one-sided transistor of the bipolar type paired transistors 106 and also to the resistor 107. A potential appeared at a connection point between the paired transistors 106 and the resistor 107 is read out by another voltage follower 108, and then is converted into a low impedance which will be applied to the cold side of the paired transistor 18. As a result, both the base terminal of the paired transistors 18 and the base terminal of the paired transistor 106 become the same potential, a current $I_3$ of the paired transistors 106 becomes $I_1^{p} I_2^{(1-p)}$ as a function of currents $I_1$ and $I_2$ of the paired transistors 18 due to the general characteristic of the bipolar element. In this case, symbol "p" is defined by $p=R_4/(R_3+R_4)$, and 9 corresponds to a function of resistance values $R_3$ and $R_4$ of the resistors 103 to 104. Since the output from the voltage follower 108 constitutes the reference potentials with respect to the paired transistors 18 and 106 and the coefficient circuits 120 to 121, there is such an effect that a voltage drop by the resistor 107 may raise the potential of the entire circuit. In other words, an output voltage $V_{ex}$ of the coefficient circuit 121 while the ground potential is used as the reference is equal to a summation between a voltage $V_{out}$ obtained by logarithmically convert the input current and the voltage drop of the resistor 107.

The added circuit portion will now be explained more in detail. The resistance values of the resistors 103 to 104 are selected to be large resistance values in order that currents flowing through the resistors 103 to 104 due to the potential difference between both the emitters of the paired transistors 18 may becomes sufficiently smaller than the currents $I_1$ and $I_2$. Also, since the potential at the positive phase input terminal of the voltage follower 105 is shifted by the high resistance values of the resistors 103 to 104 and also the bias current, another resistor is added also to the inverting input terminal so as to produce a shift having a similar magnitude. As a result, the voltage divided output from the resistors 103 to 104 may become the below-mentioned (formula 2) $V_{d3}$ based upon a voltage $V_{d1}$ of as emitter to which the current $I_1$ is supplied, another voltage $V_{d2}$ of an emitter to which the current $I_2$ is supplied, and the resistance values $R_3$ and $R_4$ of the resistors 103 to 104, while the base potential of the paired transistors 18 is used as the reference potential. Then, this voltage divided value of $V_{d3}$ is applied between the emitter and the base of one transistor of the paired transistors 106.

[Formula 2]

$$V_{d3} \frac{R_4}{R_3 + R_4} \cdot V_{d1} + \frac{R_3}{R_3 + R_4} \cdot V_{d2} = pV_{d1} + (1-p)V_{d2}$$

In order to match characteristics of transistors, since the paired transistors 106 employ the same sort as that of the paired transistors 18, a current "$I_3$" flowing through the paired transistors 106 due to the voltage $V_{d3}$ may be expressed by the following formula, while the saturation currents are equal to each other in the well-known relative formulae $I_1 \approx I_s \exp(qV_{d1}/KT)$ and $I_2 \approx I_s \exp(qV_{d2}/KT)$ (note that $I_s$: saturation current, q: electron charge $1.6'10^{-19}$(C), K: Boltzmann constant $1.38 \times 10^{-23}$(J/K), and T: absolute temperature (K)):

[Formula 3]

$$I_3 \approx I_3 \exp\left(\frac{qV_{d3}}{kT}\right)$$
$$= I_5 \exp\left\{\frac{q}{kT} \cdot pV_{d1} + \frac{q}{kT} \cdot (1-p)V_{d2}\right\}$$
$$= I_2^p \exp\left\{\frac{q}{kT} \cdot pV_{d1}\right\} - I_5^{1-p} \exp\left\{\frac{q}{kT} \cdot (1-p)V_{d2}\right\}$$
$$\approx I_1^p \cdot I_2^{1-p}$$

Figure 11:
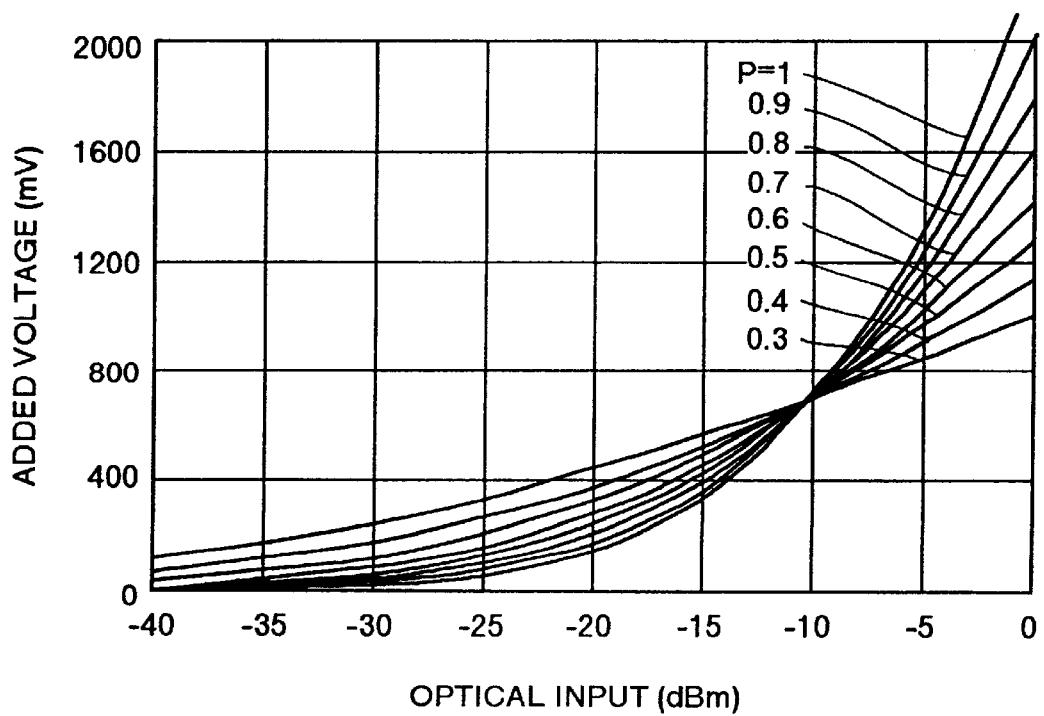
FIG. 11 is a graphic representation for explaining a shape of a curved line to be added.

In other words, as previously explained, the current $I_3$ of the paired transistor 106 is directly proportional to the current $I_1^P$. As illustrated by a curved line group of FIG. 11, when "a" is small, this current $I_3$ is gently bent (namely, radius curvature is large), whereas when "p" is increased, the current $I_3$ is rapidly bent (namely, radius curvature is small). As a consequence, various shapes may be realized by selecting "p". When this "p" is combined with the curved line B of FIG. 10 with a proper ratio, the current $I_3$ may be approximated to a straight line "A" (note that in FIG. 11, the respective curved lines are adjusted to have the same values in –10 dBm in order to compare shapes of curved lines, and a scale in Y axis is one example).

As indicated in the formula (3), the current $I_3$ is also directly proportional to the current $I_2^{(1-P)}$. This is a very important characteristic in the case that the logarithm converting circuit is used in a wide temperature range. As easily understood by tracing the formula (3) along the backward direction, since a summation between an exponent of the current $I_1$ and exponent of the current $I_2$ is equal to 1, "p" is not involved in the formula of the current $I_3$, but also both $I_s$ and T which are related to the temperature own the same form as $I_1$, and the like. As a consequence, the formula (3) can be satisfied irrespective of the temperature.

In the above-explained description, the inputs of the adder circuit constituted by the resistors 103 to 104 and the voltage follower 105 are $V_{d1}$ and $V_{d2}$. As apparent from the foregoing description, even when such a voltage drop is employed instead of $V_{d2}$, which is produced by supplying a constant current to another bipolar element, a similar effect may be achieved.

When $V_{d2}$ is used, the resulting circuit may be made simple and therefore may have advantages of compact/low-cost circuit. To the contrary, when a variation occurs, for instance, the output voltage is moved in parallel to the negative side of 300 mV, not only the resistance value of the reference current generating circuit must be changed, but also the constant of the resistor 107 must be changed, resulting in cumbersome treatments. In other words, as to a monitor circuit of 100 mV/dB, the parallel movement of the output voltage to the negative side of 300 mV may be realized by multiplying the current $I_2$ by 2. As a result, in the case of p=0.5, since the current $I_3$ becomes 1.414 times higher than $I_2$, the resistance value of the resistor 107 must be changed to be 0.707 times larger than the original resistance value. The above-explained method for using the voltage drop which is obtained by supplying the constant current to another bipolar element may own such an effect capable of reducing these cumbersome changing operations.

In the above-explained description, the voltage divider constructed of the resistors 103 to 104 is directly connected to the paired transistors 18. Alternatively, even when this voltage divider is connected via a voltage follower to the paired transistors 18, a similar operation may be carried out.

As previously explained, in accordance with this embodiment mode, the curved line which is adapted to the slightly saturated current-to-optical input characteristic of the avalanche photodiode may be selected to be added for the correction purpose. As a consequence, it is possible to provide such an optical input monitor circuit having a linear output voltage-to-optical input characteristic.

Figure 12:
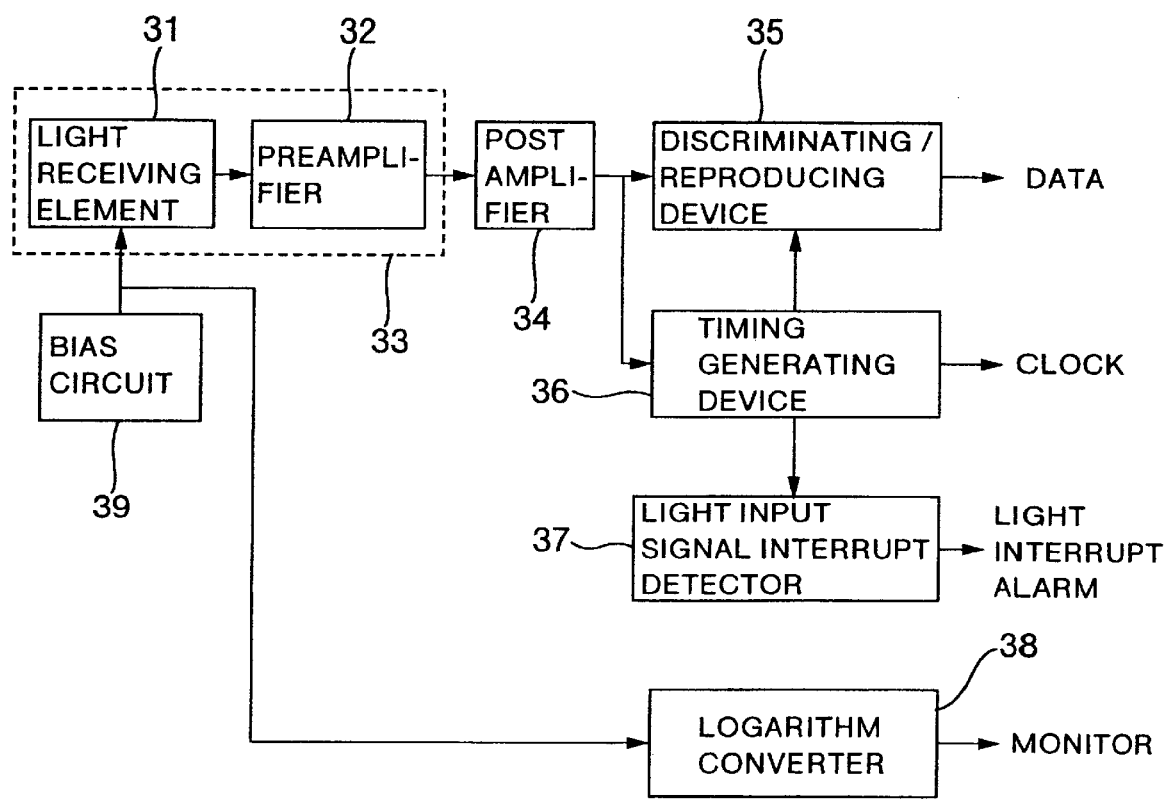
FIG. 12 is a diagram for indicating an example of a light receiver containing a temperature compensating type logarithm converter.

FIG. 12 indicates an example of a light receiver containing a temperature compensating type logarithm converter. The light receiver is arranged by a front-end unit 33, a post amplifier 34, a discriminating/reproducing device 35, a timing extracting device 36, a light input signal interrupt detector 37, and a temperature compensating type logarithm converter 38 of the present invention. The front-end unit 33 is constituted by a light receiving element 31 such as an avalanche photodiode (APD), and a preamplifier 32 for amplifying a very weak signal which is photoelectrically converted by the light receiving element 31. The post amplifier 34 amplifies the output signal from the preamplifier of the front-end unit 33. The discriminating/reproducing device 35 enters thereinto the output signal of the post amplifier 34 so as to discriminate/reproduce this signal. The timing extracting device 36 extracts a clock component. The light input signal interrupt detector 37 produces an alarm when a light input reception strength is deteriorated. It should be noted that a bias circuit 39 corresponds to a high voltage generating circuit for APD. In such a case that a photodiode (PD) is used as the light receiving element 31, the bias circuit 39 may be arranged by the normal bias circuit.

With employment of this circuit arrangement, an optical signal which is received/entered from a transmission path such as an optical fiber may be outputted as an electric signal, data, and a clock. Conventionally, the light receiver judges "1" or "0"based upon the output of the light input signal interrupt detector. However, since this system is employed, the deterioration information of the transmission path can be acquired in advance from the light input reception strength. As a consequence, the light receiver can receive the light signal having higher reliability.

As previously explained, it should be noted that the circuit arrangement of FIG. 12 is a general-purpose circuit arrangement, and the PD may be conceived as the light receiving element 31 other than the APD. If the discriminating/reproducing device 35 may have a high gain, then the post amplifier 34 may be omitted. To extract timing, such a circuit may be conceived which employs a PLL and a filter of an SAW. Alternatively, when the discriminating/reproducing function and also the timing extracting function are not required, both the discriminating/reproducing device 35 and the timing extracting device 36 may be omitted. The light input signal interrupt detector 37 may make a judgement by checking an amplitude of a clock component, or alternatively, may be arranged by utilizing the temperature compensating type logarithm converter 38 of the present invention. Furthermore, an integral type light receiver may be constituted by adding a light transmitter to the light receiver of the present invention.

On the other hand, when this circuit is mounted on the light transmitter, there is a merit while an output of a light emitting element is received by a monitoring light receiving element, a system similar to the above-described system may be employed.

Furthermore, both the above-described light transmitter and light receiver, or the above-described integral type light transmitter/receiver is mounted on an optical communication apparatus, so that an optical communication system may be arranged. Normally, in such an optical communication system, when a first communication system is brought into a failure condition, the present communication system is required to be switched to a second communication system in order to improve reliability. Conventionally, the communication systems are switched by mainly using the output of the light input signal interrupt detector. The light input signal interrupt detector does not output the detection signal until the communication system is brought into the completely failure state. To the contrary, in accordance with the present technique, since the detection level of the logarithmic-converted monitor signal can be freely set by employing a comparator and the like, the failure can be previously sensed, and then, this failure information is transferred to the control unit of the optical communication apparatus. Thereafter, the control unit can transfer the information for switching the troubled communication system to the relevant units within this optical communication apparatus, and also to the optical communication apparatus functioning as the counter party apparatus.

Also, in a so-called "WDM" optical communication system for multiplexing optical signals having a plurality of wavelengths to transmit multiplexed optical signals, light receivers are mounted with respect to each of demultiplexed wavelengths in an optical communication apparatus on the reception side.

Since the light input signal detecting function according to this technique is employed in this light receiver, the failure condition can be grasped every wavelength, there is a further merit.

There is no problem when an optical communication apparatus is installed in a perfectly air-conditioned area. More specifically, in optical communication systems, distances among optical communication apparatuses are very long, and environments under which these optical communication apparatuses are installed are different from each other. There are certain possibilities that some optical communication apparatuses are installed at bat environmental outdoor places such as on a pole. As a consequence, since the light receivers containing the temperature compensating type logarithm converting circuits designed by the same design concept can be applied to any environments, there is a great merit.

What is claimed is:

1. A temperature compensating circuit comprising:
   a first circuit network between an inverting input terminal of an operational amplifier and an output terminal of said operational amplifier; and
   a second circuit network between the inverting input terminal of said operational amplifier and a reference potential; wherein:
   at least one of said first circuit network and said second circuit network is made of an arrangement containing a plurality of series-connected thermistor/resistor pairs in which the thermistors are connected parallel to the resistors; and
   said temperature compensating circuit compensates a temperature-dependent signal which is inputted into a positive phase input terminal of said operational amplifier, and outputs the temperature-compensated signal.

2. A temperature compensating logarithm converting circuit comprising: a logarithm converting circuit, wherein:
   an output terminal of said logarithm converting circuit is connected to the input of the temperature compensating circuit as recited in claim 1.

3. A temperature compensating circuit comprising:
   a first circuit network between an inverting input terminal of an operational amplifier and an output terminal of said operational amplifier; and
   a second circuit network between the inverting input terminal of said operational amplifier and a signal input terminal thereof; wherein:
   a positive phase input terminal of said operational amplifier is connected to a reference potential;
   at least one of said first circuit network and said second circuit network is made of an arrangement containing a plurality of series-connected thermistor/resistor pairs in which the thermistors are connected parallel to the resistors; and
   said temperature compensating circuit compensates a temperature-dependent signal which is inputted into a said signal input terminal of said operational amplifier, and outputs the temperature-compensated signal.

4. A temperature compensating logarithm converting circuit comprising: a logarithm converting circuit, wherein:
   an output terminal of said logarithm converting circuit is connected to the input of the temperature compensating circuit as recited in claim 3.

5. A temperature compensating logarithm converting circuit comprising:
   a logarithm converting circuit for logarithmically converting an input signal to differentially output the logarithmically-converted input signals;
   a first temperature compensating circuit including: a first circuit network between an inverting input unit of a first operational amplifier and an output unit of said first operational amplifier; and a second circuit network between the inverting input unit of said first operational amplifier and a first voltage; in which: at least one of said first circuit network and said second circuit network is made of an arrangement containing a plurality of series-connected thermistor/resistor pairs in which the thermistors are connected parallel to the resistors; and said first temperature compensating circuit compensates a temperature-dependent signal to thereby output the temperature-compensated signal, while one of the differential outputs of said logarithm converting circuit is entered into a positive phase input unit of said first operational amplifier; and
   a second temperature compensating circuit including: a third circuit network between an inverting input unit of a second operational amplifier and an output unit of said second operational amplifier; and a fourth circuit network between the inverting input unit of said second operational amplifier and the output unit of said first temperature compensating circuit; in which: at least one of said third circuit network and said fourth circuit network is made of an arrangement containing a plurality of series-connected thermistor/resistor pairs in which the thermistors are connected parallel to the resistors; and said second temperature compensating circuit compensates a temperature-dependent signal to thereby output the temperature-compensated signal, while the other differential output of said logarithm converting circuit is entered into a positive phase input unit of said second operational amplifier; wherein:

in the case that a gain defined from the positive phase input unit of said first temperature compensating circuit up to the output of said first temperature compensating circuit is equal to (1+G), a gain defined from the input unit of said second temperature compensating circuit up to the output of said second temperature compensating circuit is nearly equal to (1+(1/G)).

6. A temperature compensating logarithm converting circuit as claimed in claim 5 wherein:

said temperature compensating logarithm converting circuit is comprised of:

an adding circuit for entering thereinto a voltage of one output unit of said logarithm converting circuit as a first input, and for entering thereinto a voltage of the other output unit of said logarithm converting circuit as a second input, in which an output of said adding circuit is equal to a summation between p-times multiplied first input voltage (p>0) and (1−p) times multiplied second input voltage;

a bipolar element in which the output voltage of said adding circuit is applied to the emitter thereof;

a resistor whose one terminal is connected to the base of said bipolar element; and a voltage follower circuit in which one terminal of said resistor is connected to the input unit thereof, and the output unit thereof is connected to said first voltage; wherein:

a potential difference between the output unit of said second operational amplifier and the other terminal of said resistor is outputted.

* * * * *